(12) United States Patent
Shen et al.

(10) Patent No.: US 10,056,407 B2
(45) Date of Patent: Aug. 21, 2018

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Hsiang-Ku Shen, Hsinchu (TW); Yu-Lien Huang, Hsinchu (TW); Wilson Huang, Hsinchu (TW); Janet Chen, Hsinchu (TW); Jeng-Ya David Yeh, Hsinchu (TW)

(73) Assignee: Taiwan Semiconductor Manufacturing Co., Ltd, Hsinchu (TW)

( * ) Notice: Subject to any disclaimer, the term of this patent is extended or adjusted under 35 U.S.C. 154(b) by 20 days.

(21) Appl. No.: 15/061,621

(22) Filed: Mar. 4, 2016

(65) Prior Publication Data

US 2017/0256568 A1    Sep. 7, 2017

(51) Int. Cl.
*H01L 21/84* (2006.01)
*H01L 27/12* (2006.01)
*H01L 29/66* (2006.01)
*H01L 29/417* (2006.01)
*H01L 29/49* (2006.01)
*H01L 21/768* (2006.01)

(52) U.S. Cl.
CPC .... *H01L 27/1211* (2013.01); *H01L 21/76897* (2013.01); *H01L 21/845* (2013.01); *H01L 29/41791* (2013.01); *H01L 29/495* (2013.01); *H01L 29/4958* (2013.01); *H01L 29/4966* (2013.01); *H01L 29/4975* (2013.01); *H01L 29/6656* (2013.01); *H01L 29/66628* (2013.01); *H01L 21/76829* (2013.01)

(58) Field of Classification Search
None
See application file for complete search history.

(56) References Cited

U.S. PATENT DOCUMENTS

| | | | |
|---|---|---|---|
| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |

(Continued)

*Primary Examiner* — Abul Kalam
(74) *Attorney, Agent, or Firm* — McDermott Will & Emery LLP

(57) ABSTRACT

A semiconductor device includes a first gate structure disposed on a substrate. The first gate structure includes a first gate electrode, a first cap insulating layer disposed over the first gate electrode and first sidewall spacers disposed on both side faces of the first gate electrode and the first cap insulating layer. The semiconductor device further includes a first protective layer formed over the first cap insulating layer and at least one of the first sidewall spacers. The first protective layer includes at least one selected from the group consisting of AlON, AlN and amorphous silicon.

20 Claims, 8 Drawing Sheets

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,153,498 B2 * | 10/2015 | Xie ................... H01L 29/6653 |
| 2014/0001574 A1 | 1/2014 | Chen et al. |
| 2014/0110755 A1 | 4/2014 | Colinge |
| 2014/0151812 A1 | 6/2014 | Liaw |
| 2015/0021683 A1 * | 1/2015 | Xie ................... H01L 29/6653 |
| | | 257/330 |
| 2015/0137273 A1 * | 5/2015 | Zhang ............... H01L 29/66545 |
| | | 257/412 |
| 2015/0263160 A1 * | 9/2015 | Xie ................... H01L 29/6653 |
| | | 257/329 |
| 2015/0364326 A1 * | 12/2015 | Xie ..................... H01L 29/665 |
| | | 257/288 |
| 2015/0364378 A1 * | 12/2015 | Xie ................ H01L 21/823437 |
| | | 257/368 |
| 2016/0284817 A1 * | 9/2016 | Basker ............. H01L 29/66545 |
| 2017/0186849 A1 * | 6/2017 | Chen ..................... H01L 29/518 |
| 2017/0194211 A1 * | 7/2017 | Lai .................. H01L 21/823418 |

\* cited by examiner

SEMICONDUCTOR DEVICE AND A METHOD FOR FABRICATING THE SAME

TECHNICAL FIELD

The disclosure relates to a method for manufacturing a semiconductor device, and more particularly to a structure and a manufacturing method for a conductive layer over source/drain regions.

BACKGROUND

As the semiconductor industry introduces new generations of integrated circuits (ICs) having higher performance and greater functionality, multi-layer metal wiring structures disposed over the underlying electronic devices such as transistors have been employed. To meet requirements for a higher speed and a more reliability, advanced metal wire forming methods and structures have been developed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
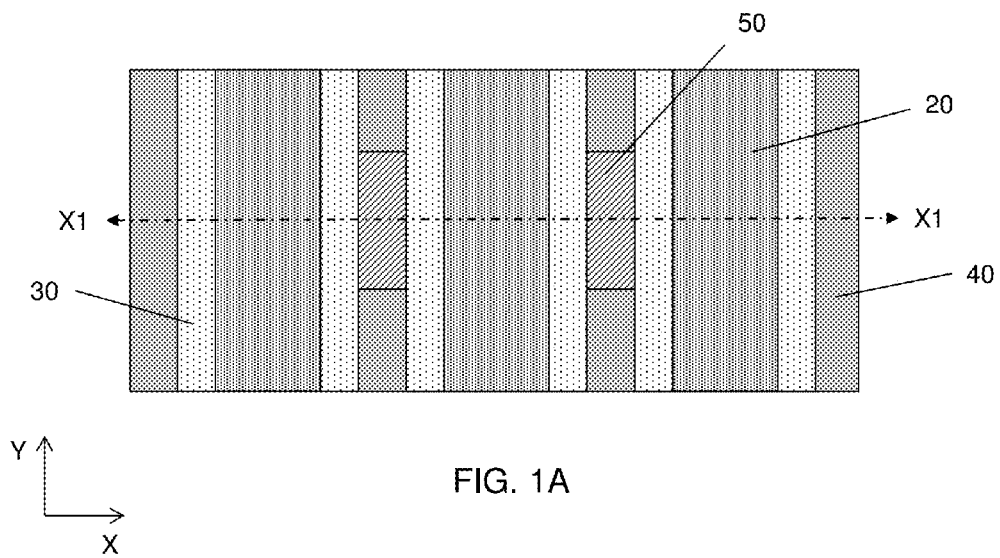
FIG. 1A shows an exemplary plan view (viewed from the above) illustrating one of the various stages of a sequential fabrication process of a semiconductor device according to one embodiment of the present disclosure.
Figure 1B:
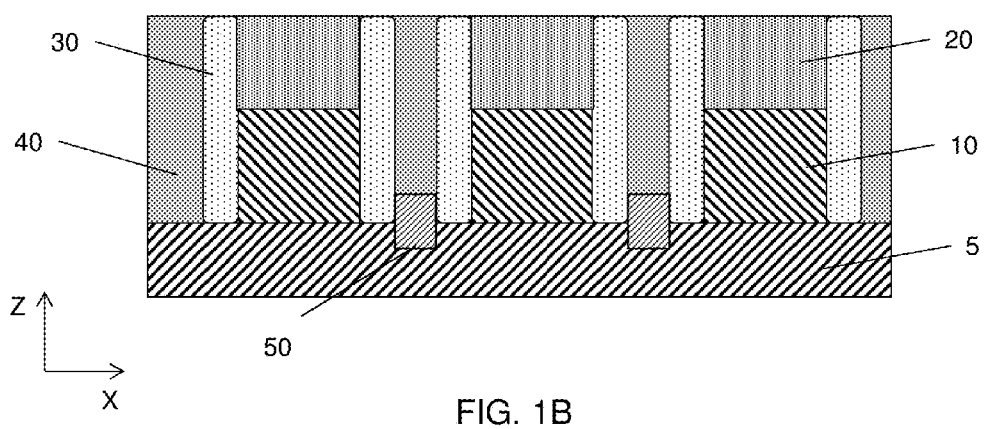
FIG. 1B shows an exemplary cross sectional view along line X1-X1 of FIG. 1A.

FIGS. 1A and 1B show one of the stages of a sequential fabrication process of a semiconductor device according to one embodiment of the present disclosure. FIG. 1A shows a plan (top) view and FIG. 1B shows a cross sectional view along line X1-X1 of FIG. 1A.

FIGS. 1A and 1B show a structure of a semiconductor device after metal gate structures are formed. In FIGS. 1A and 1B, metal gate structures 10 are formed over a channel layer 5, for example, a part of a fin structure, and cap insulating layers 20 are disposed over the metal gate structures 10. The thickness of the metal gate structures 10 is in a range from 15 nm to 50 nm in some embodiments. The thickness of the cap insulating layer 20 is in a range from about 10 nm to about 30 nm in some embodiments, and is in a range from about 15 nm to about 20 nm in other embodiments. Sidewall spacers 30 are provided on sidewalls of metal gate structure 10 and the cap insulating layer 20. The film thickness of the sidewall spacers 30 at the bottom of the sidewall spacers is in a range from about 3 nm to about 15 nm in some embodiments, and is in a range from about 4 nm to about 10 nm in other embodiments. The combination of the metal gate structure 10, the cap insulating layer 20 and sidewall spacers 30 may be collectively referred to as a gate structure. Further, source/drain regions 50 are formed adjacent to the gate structures, and spaces between the gate structures are filled with a first interlayer dielectric (ILD) layer 40.

Figure 1C:
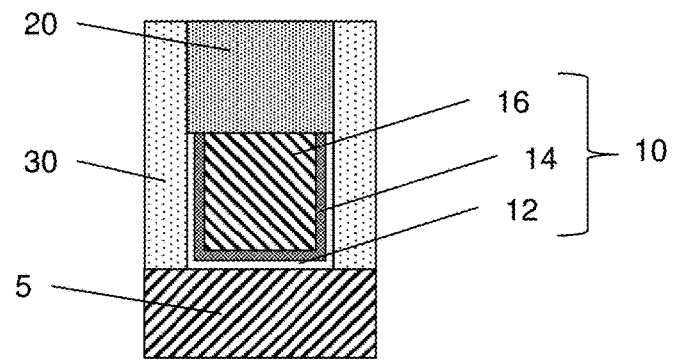
FIG. 1C is an enlarged view of the gate structure.

FIG. 1C is an enlarged view of the gate structure. The metal gate structure 10 includes one or more layers 16 of metal material, such as Al, Cu, W, Ti, Ta, TiN, TiAl, TiAlC, TiAlN, TaN, NiSi, CoSi, other conductive materials. A gate dielectric layer 12 disposed between the channel layer 5 and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

In some embodiments, one or more work function adjustment layers 14 are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20 includes one or more layers of insulating material such as silicon nitride based material including SiN, SiCN and SiOCN. The sidewall spacer 30 is made of a different material than the cap insulating layer 20 and includes one or more of insulating material such as silicon nitride based material including SiN, SiON, SiCN and SiOCN. The first ILD layer 40 includes one or more layers of insulating material such as silicon oxide based material such as silicon dioxide (SiO$_2$) and SiON.

The material of the sidewall spacer 30, the material of the cap insulating layer 20, and a material of the first ILD layer 40 are different from each other, so that each of these layers can be selectively etched. In one embodiment, the sidewall spacer 30 is made of SiOCN, SiCN or SiON, the cap insulating layer 20 is made of SiN, and the first ILD 40 layer is made of SiO$_2$.

In this embodiment, fin field effect transistors (Fin FETs) fabricated by a gate-replacement process are employed.

Figure 1D:
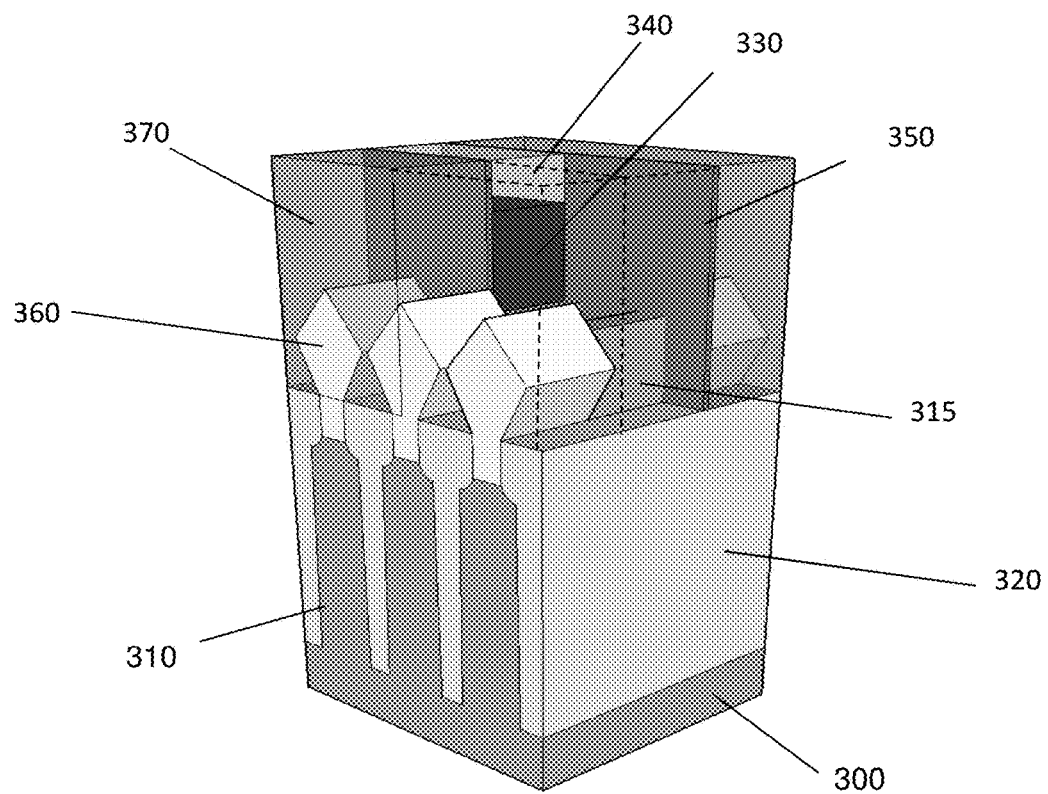
FIG. 1D shows an exemplary perspective view illustrating one of the various stages of a sequential fabrication process of a semiconductor device according to one embodiment of the present disclosure.

FIG. 1D shows an exemplary perspective view of a Fin FET structure.

First, a fin structure 310 is fabricated over a substrate 300. The fin structure includes a bottom region and an upper region as a channel region 315. The substrate is, for example, a p-type silicon substrate with an impurity concentration in a range from about $1\times10^{15}$ cm$^{-3}$ to about $1\times10^{18}$ cm$^{-3}$. In other embodiments, the substrate is an n-type silicon substrate with an impurity concentration in a range from about $1\times10^{15}$ cm$^{-3}$ to about $1\times10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region. After a planarization operation, the dummy gate structure is removed so as to make a gate space. Then, in the gate space, a metal gate structure 330 including a metal gate electrode and a gate dielectric layer, such as a high-k dielectric layer, is formed. Further, the cap insulating layer 340 is formed over the metal gate structure 330, so as to obtain the Fin FET structure shown in FIG. 1D. In FIG. 1D, parts of the metal gate structure 330, the cap isolation layer 340, sidewalls 330 and the ILD 370 are cut to show the underlying structure.

The metal gate structure 330, the cap isolation layer 340, sidewalls 330, source/drain 360 and the ILD 370 of FIG. 1D substantially correspond to the metal gate structures 10, cap insulating layers 20, sidewall spacers 30, source/drain regions 50 and first interlayer dielectric layer (ILD) 40, of FIGS. 1A and 1B, respectively.

FIGS. 2-10 show exemplary cross sectional views corresponding to line X1-X1 of FIG. 1A, illustrating various stages of the sequential fabrication process of a semiconductor device according to one embodiment of the present disclosure. It is understood that additional operations can be provided before, during, and after processes shown by FIGS. 2-10, and some of the operations described below can be replaced or eliminated, for additional embodiments of the method. The order of the operations/processes may be interchangeable.

Figure 2:
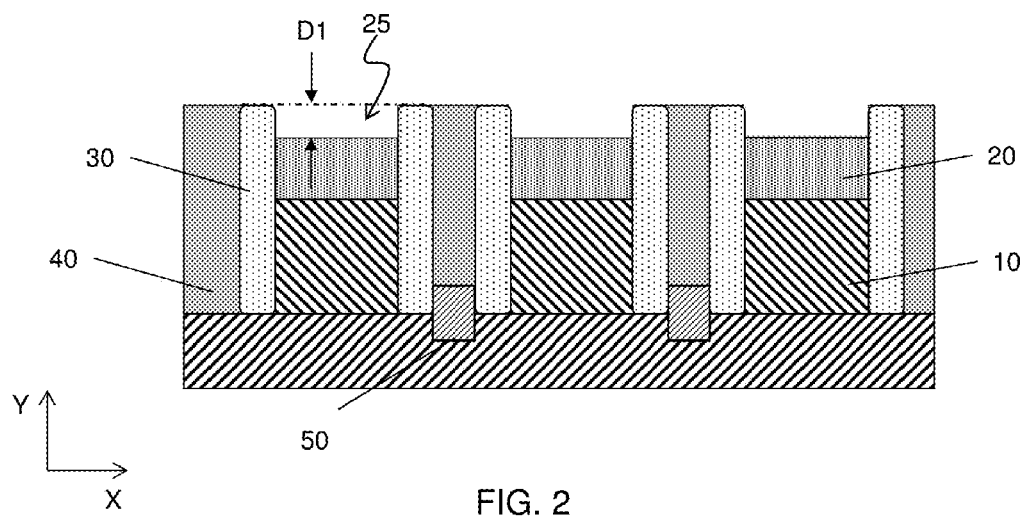
FIGS. 2-8 show exemplary cross sectional views corresponding to line X1-X1 of FIG. 1A illustrating various stages of the sequential fabrication process of a semiconductor device according to one embodiment of the present disclosure.

As shown in FIG. 2, the cap insulating layer 20 is recessed by using a dry and/or a wet etching process. Since the cap insulating layer 20 is made of a material different from the sidewall spacers 30 and the first ILD layer 40, the cap insulating layer 20 can be substantially selectively etched. The depth D1 of the recessed space 25 measured from the upper surface of the first ILD layer 40 is in a range from about 3 nm to about 10 nm in some embodiments, and is in a range from about 4 nm to about 8 nm in other embodiments.

Figure 3:
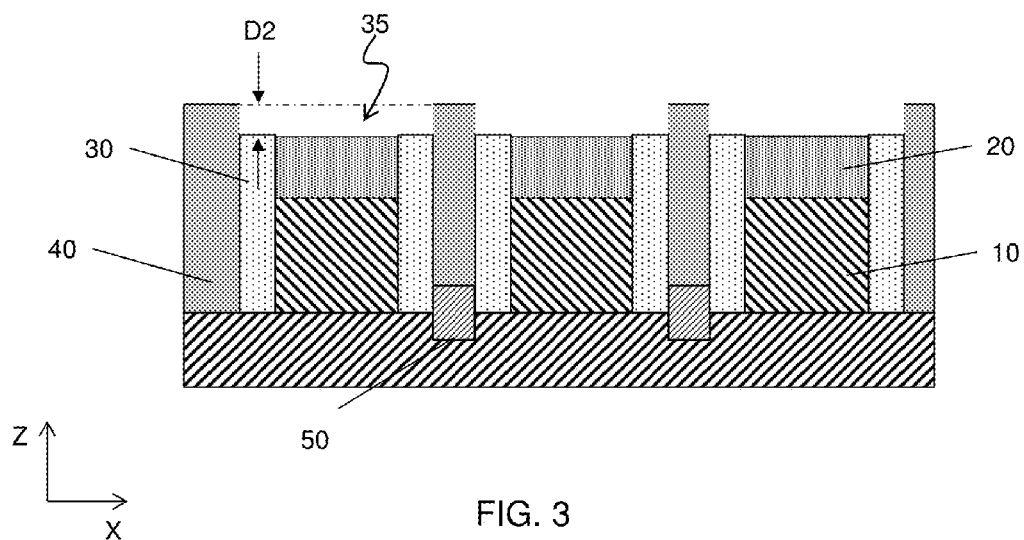

As shown in FIG. 3, the sidewall spacers 30 are recessed by using a dry and/or a wet etching process, thereby forming a recessed space 35. Since the sidewall spacers 30 are made of a material different from the cap insulating layer 20 and the first ILD layer 40, the sidewall spacer layers 30 can be substantially selectively etched. The depth D2 measured from the upper surface of the first ILD layer 40 is in a range from about 3 nm to about 10 nm in some embodiments, and is in a range from about 4 nm to about 8 nm in other embodiments.

The depth D2 is substantially the same as the depth D1, and if different, the difference is within about 1 nm. It is noted that the cap insulating layer 20 may be recessed after the sidewall spacers 30 are recessed.

Figure 4:
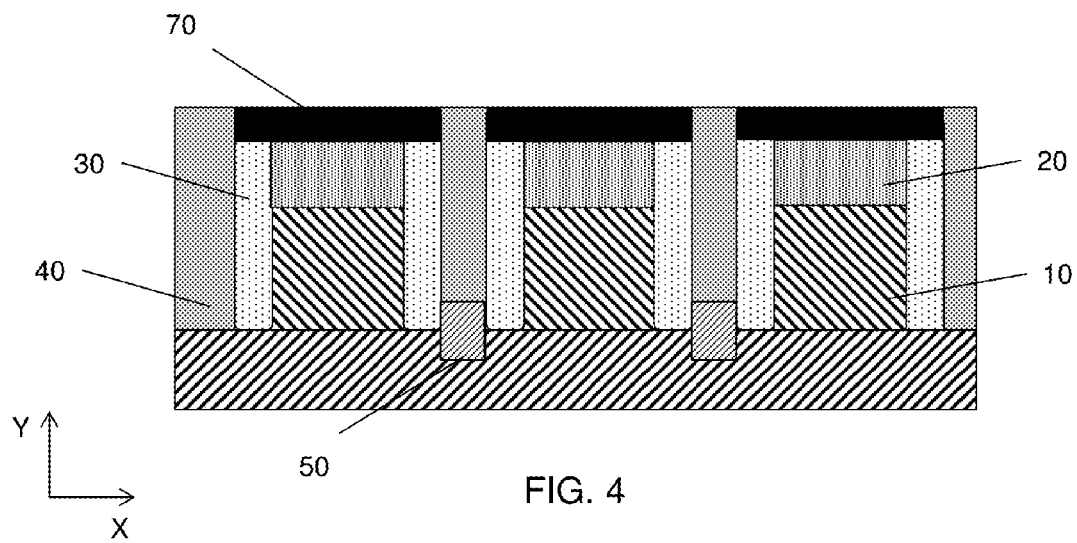

Then, a protective layer 70 is formed in the recessed space 35, as shown in FIG. 4. One or more blanket layers are formed over the structure shown in FIG. 3, and a planarization operation, such as an etch-back process and/or a chemical mechanical polishing (CMP) process, is performed. After the planarization operation, the thickness of the protective layer 70 is in a range from about 3 nm to about 10 nm in some embodiments, and is in a range from about 4 nm to about 8 nm in other embodiments.

The protective layer 70 is made of a material which has a high etching resistivity against a silicon oxide based material. In some embodiments, a transition metal nitride based material, amorphous silicon or poly silicon is used as the protective layer 70. As a transition metal nitride based material, AlON, AlN, TiN or TaN is used. In addition, oxide of aluminum, tantalum, titanium, zirconium or hafnium may also be used as the protective layer 70.

Figure 5:
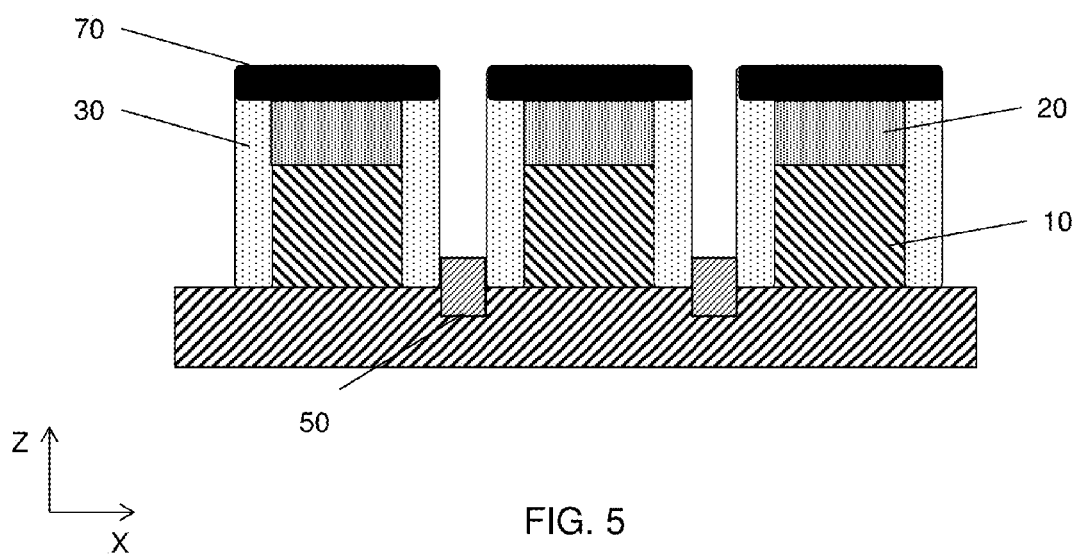

After the protective layer 70 is formed, the first ILD layer 40 is removed, as shown in FIG. 5 by using a suitable etching operation.

Figure 6:
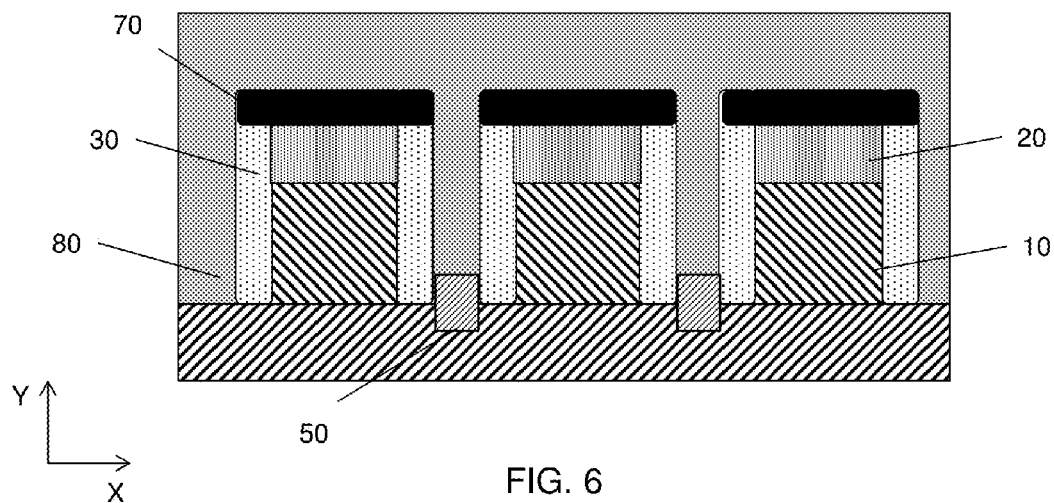

Then, as shown in FIG. 6, a second ILD 80 is formed over the structure of FIG. 5. The second ILD layer 80 includes one or more layers of insulating material including a silicon oxide based material, such as silicon dioxide ($SiO_2$) and SiON, or a low-k dielectric material.

Figure 7:
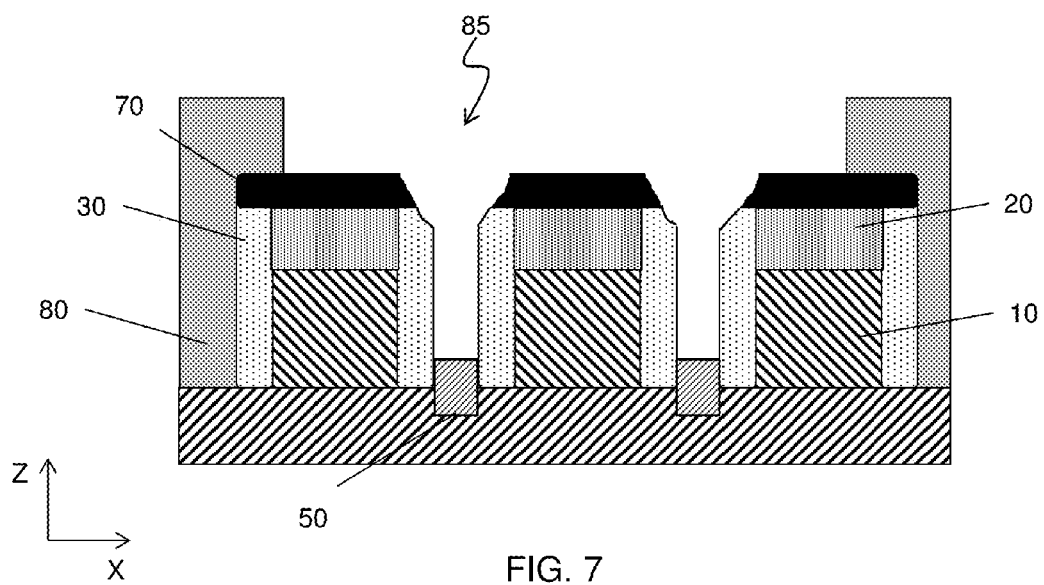

After forming the second ILD layer 80, a contact hole 85 is formed by using a lithography operation and an etching operation, so at to expose at least one source/drain region 50. As shown in FIG. 7, during the contact hole etching, a part of the protective layer 70 and a part of the sidewall spacers 30 are also etched. However, since the protective layer 70 has a higher etching resistivity than the sidewall spacers during the contact hole etching, which is oxide etching, the amount of etched portion of the sidewall spacers 30 can be minimized. Moreover, due to the protective layer 70, the cap insulating layer 20 is not etched during the contact hole etching. Thus, the upper ends of the cap insulating layer 20 maintain the substantially right angle corners. Since the cap insulating layer 20 is protected from being etched, a short circuit between the metal gate 10 and the source/drain contact 95 (see FIGS. 9 and 10) can be avoided.

Figure 8:
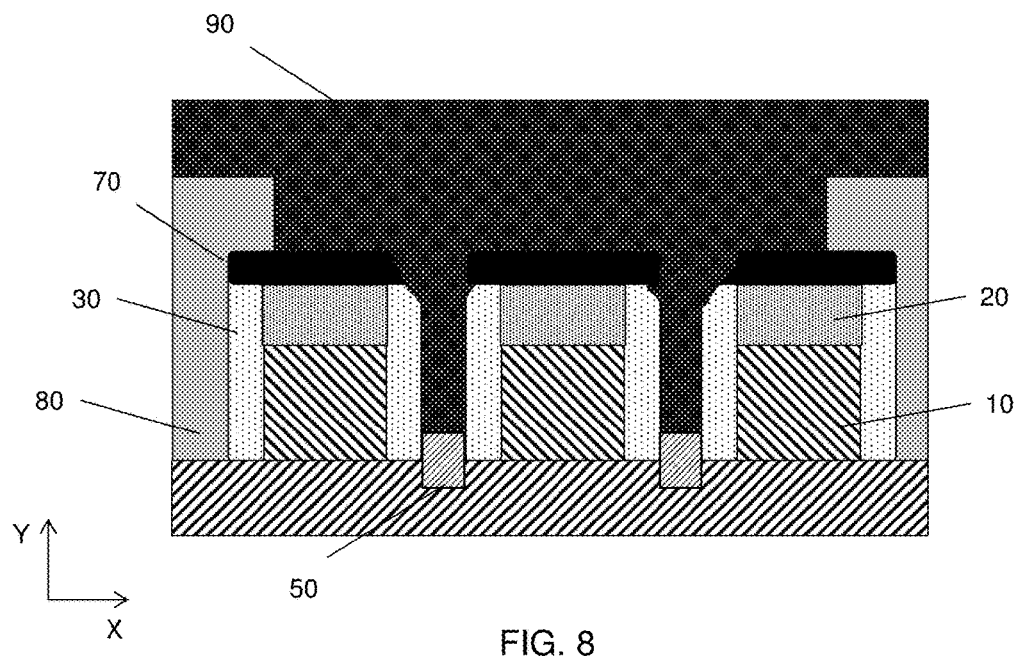

After the contact hole 85 is formed, a conductive material 90 is formed over the structure of FIG. 7. As shown in FIG. 8, one or more layers of conductive material 90, such as tungsten, titanium, cobalt, tantalum, copper, aluminum or nickel, or silicide thereof, or other suitable materials, are formed over the structure of FIG. 7. Then, a planarization operation, such as a CMP process, is performed, so as to obtain the structure of FIG. 9. The space between two gate structures is filled by the conductive material, thereby forming a source/drain contact 95 in contact with the source/drain region 50.

Figure 9:
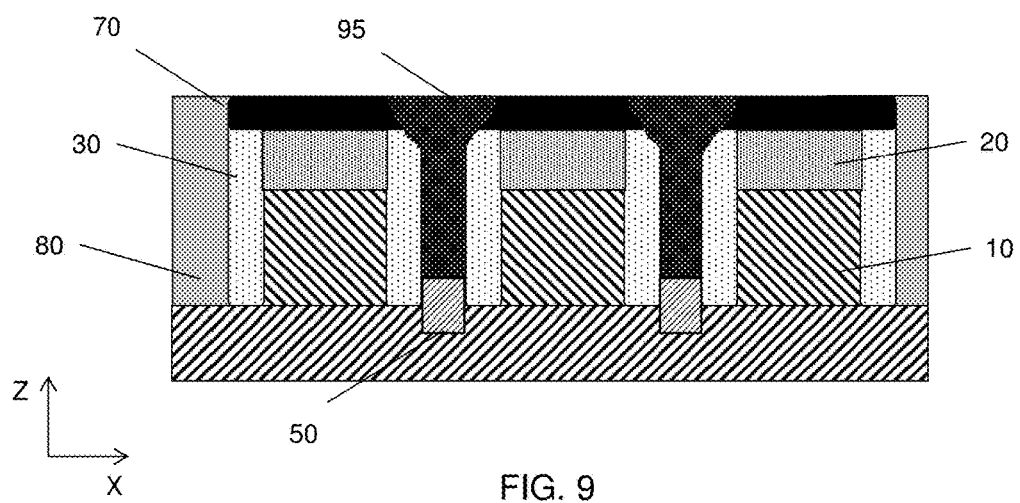
FIGS. 9 and 10 show exemplary cross sectional views according to another embodiment of the present disclosure.

In this embodiment, the protective layer 70 is not removed and remains as shown in FIG. 9. In such a case, the protective layer 70 can function as a polishing stop layer in the CMP process, and is made of an insulating material such as AlON or AlN.

These source/drain contact 95 contacts the source/drain region 50. It is noted that upper surfaces of the cap insulating layers 20, upper surfaces (top portion) of the second ILD layer 80 and source/drain contact 95 are substantially flush with each other, i.e., on the same plane.

Figure 10:
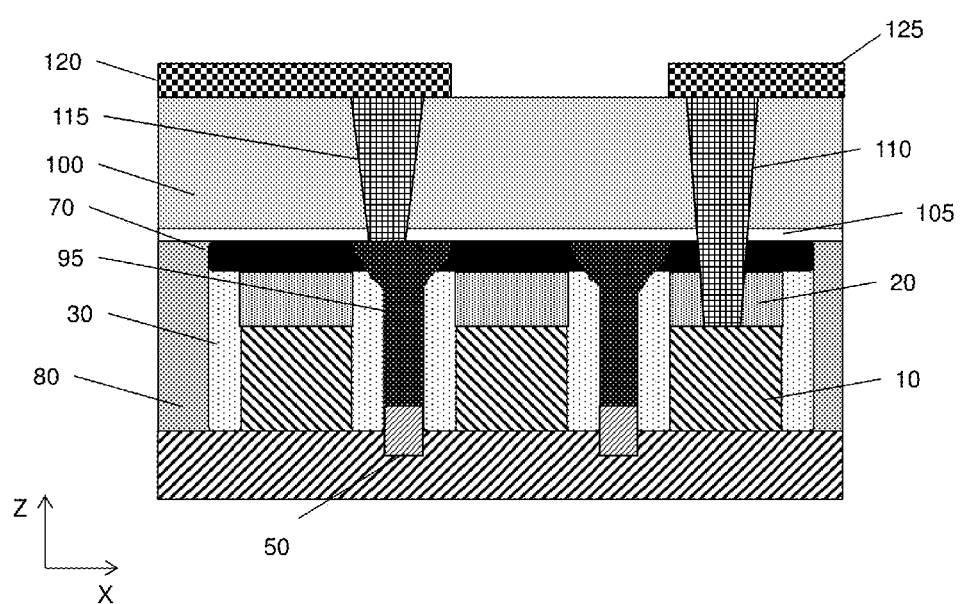

After the source/drain contact 95 is formed, an etching-stop layer (ESL) 105 and a third ILD layer 100 are formed over the structure of FIG. 9. Then, a patterning operation is performed to form via holes. The via holes are filed with one or more conductive materials so as to form via plugs 110, 115, and a first metal wiring 120 and a second metal wiring 125 are formed over the via plugs 110 and 115, respectively, as shown in FIG. 10. The first and second metal wirings and the via plugs can be formed by a dual damascene method. In some embodiments, the ESL 105 is not formed.

It is understood that the device shown in FIG. 10 undergoes further CMOS processes to form various features such as interconnect metal layers, dielectric layers, passivation layers, etc.

Figure 11:
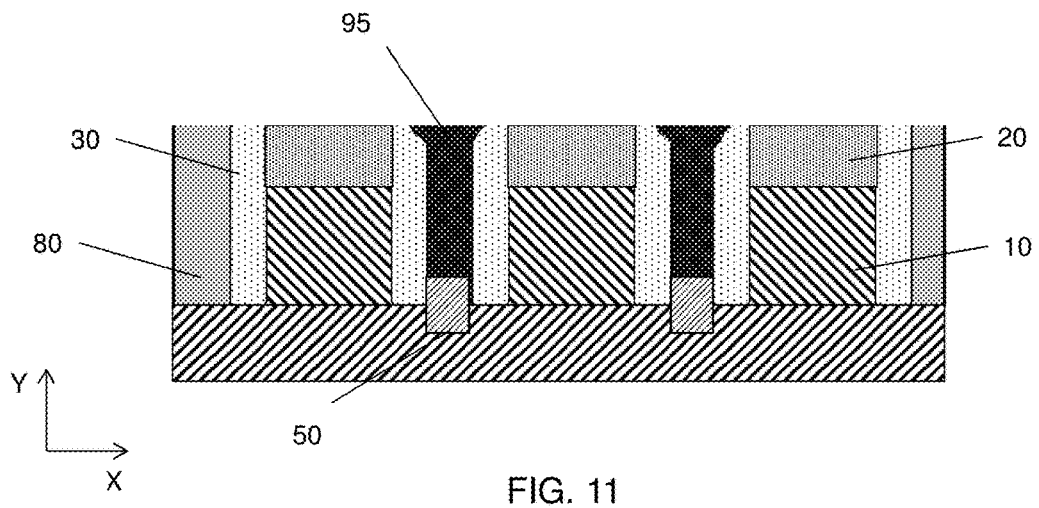
FIGS. 11 and 12 show exemplary cross sectional views according to another embodiment of the present disclosure.
Figure 12:
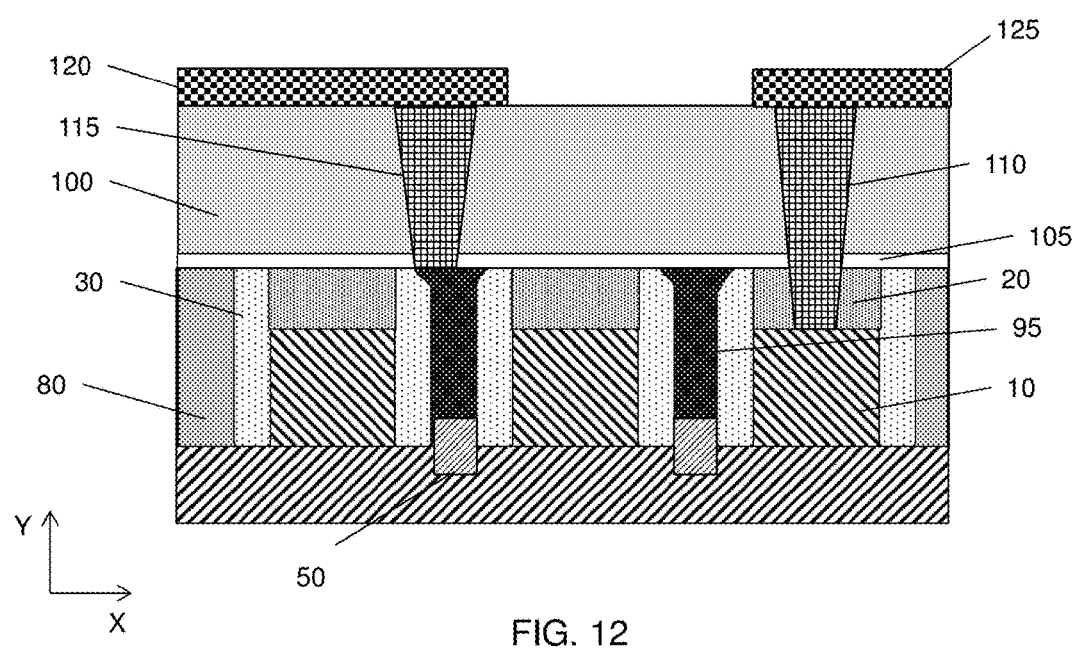

FIGS. 11 and 12 show exemplary cross sectional views according to another embodiment of the present disclosure.

In the above embodiment, the protective layer 70 remains over the metal gate. In this embodiment, the protective layer 70 is removed.

After the conductive material 90 is formed as shown in FIG. 8, a planarization operation is performed to remove upper portions of the conductive material 90 and the protective layer 70, as shown in FIG. 11. In such a case, the cap insulating layer 20 can function as a polishing stop layer in the CMP process.

Then, similar to FIG. 10, after the source/drain contact 95 is formed, a CESL 105 and a third ILD layer 100 are formed, and a patterning operation is performed to form via holes. The via holes are filed with one or more conductive materials so as to form via plugs 110, 115, and a first metal wiring 120 and a second metal wiring 125 are formed over the via plugs 110 and 115, respectively, as shown in FIG. 12.

It is understood that the device shown in FIG. 10 undergoes further CMOS processes to form various features such as interconnect metal layers, dielectric layers, passivation layers, etc.

The various embodiments or examples described herein offer several advantages over the existing art. For example, in the present disclosure, since a protective layer 70 is formed over the metal gate, the sidewall spacers and the cap insulating layer, it is possible to prevent the cap insulating layer from being etched during a contact hole etching, thereby preventing a short circuit between the metal gate and the source/drain contact.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, a first gate structure and a second gate structure are formed over a substrate. The first gate structure includes a first gate electrode, a first cap insulating layer disposed over the first gate electrode and first sidewall spacers disposed on both side faces of the first gate electrode and the first cap insulating layer. The second gate structure includes a second gate electrode, a second cap insulating layer disposed over the second gate electrode and second sidewall spacers disposed on both side faces of the second gate electrode and the second cap insulating layer. A first source/drain region is formed in an area between the first gate structure and the second gate structure. A first insulating layer is formed over the first source/drain region and between the first gate structure and the second gate structure. After the forming the first insulating layer, the first and second cap insulating layers are recessed, and the first and second sidewall spacers are recessed, thereby forming a first space over the recessed first cap insulating layer and the recessed first sidewall spacers and a second space over the recessed second cap insulating layer and the recessed second sidewall spacers. A first protective layer is formed in the first space and a second protective layer is formed in the second space. The first and second protective layers include at least one selected from the group consisting of a transition metal nitride based material and amorphous silicon.

According to another aspect of the present disclosure, in a method of manufacturing a semiconductor device, a first gate structure and a second gate structure are formed over a substrate. The first gate structure includes a first gate electrode, a first cap insulating layer disposed over the first gate electrode and first sidewall spacers disposed on both side faces of the first gate electrode and the first cap insulating layer. The second gate structure includes a second gate electrode, a second cap insulating layer disposed over the second gate electrode and second sidewall spacers disposed on both side faces of the second gate electrode and the second cap insulating layer. A first source/drain region is formed in an area between the first gate structure and the second gate structure. A first insulating layer is formed over the first source/drain region and between the first gate structure and the second gate structure. After the forming the first insulating layer, the first and second cap insulating layers are recessed, and the first and second sidewall spacers are recessed, thereby forming a first space over the recessed first cap insulating layer and the recessed first sidewall spacers and a second space over the recessed second cap insulating layer and the recessed second sidewall spacers. A first protective layer is formed in the first space and a second protective layer is formed in the second space. A second insulating layer is formed over the first and second gate structures having the first and second protective layers. A contact hole is formed over the source/drain region so as to expose the source/drain region. The contact hole is filled with a conductive material, thereby forming a contact plug that is in contact with the source/drain region. The first and second protective layers are removed.

In accordance with yet another aspect of the present disclosure, a semiconductor device includes a first gate structure disposed on a substrate. The first gate structure includes a first gate electrode, a first cap insulating layer disposed over the first gate electrode and first sidewall spacers disposed on both side faces of the first gate electrode and the first cap insulating layer. The semiconductor device further includes a first protective layer formed over the first cap insulating layer and at least one of the first sidewall spacers. The first protective layer includes at least one selected from the group consisting of AlON, AlN and amorphous silicon.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first gate structure and a second gate structure over a substrate, the first gate structure including a first gate electrode, a first cap insulating layer disposed over the first gate electrode and first sidewall spacers disposed on both side faces of the first gate electrode and the first cap insulating layer, the second gate structure including a second gate electrode, a second cap insulating layer disposed over the second gate electrode and second sidewall spacers disposed on both side faces of the second gate electrode and the second cap insulating layer;
    forming a first source/drain region in an area between the first gate structure and the second gate structure;
    forming a first insulating layer over the first source/drain region and between the first gate structure and the second gate structure;
    after the first insulating layer is formed, forming a first space over the first cap insulating layer and over the first sidewall spacers by recessing the first cap insulating layer and the first sidewall spacers, and a second space over the second cap insulating layer and over the second sidewall spacers by recessing the second cap insulating layer and the second sidewall spacers; and
    forming a first protective layer in the first space and a second protective layer in the second space;
    after the first and second protective layers are formed, removing the first insulating layer, to expose the first source/drain region;
    after the first insulating layer is removed, forming a second insulating layer to cover the first and second gate structures having the first and second protective layers;
    removing a part of the second insulating layer above the source/drain region to form a contact hole; and
    filling the contact hole with a conductive material to form a contact plug that is in contact with the source/drain region,
    wherein the first and second protective layers include at least one selected from the group consisting of a metal nitride based material and amorphous silicon.

2. The method of claim 1, wherein the metal nitride based material is AlON or AlN.

3. The method of claim 1, wherein the amorphous silicon is boron-doped amorphous silicon.

4. The method of claim 1, wherein a material of the first and second sidewall spacers, a material of the first and second cap insulating layer, and a material of the first insulating layer are different from each other.

5. The method of claim 1, wherein:
    the first and second sidewall spacers are made of SiOCN,
    the first and second cap insulating layers are made of SiN, and
    the first insulating layer is made of $SiO_2$.

6. The method of claim 1, wherein:
    the recessing the first and second cap insulating layers is performed by selectively etching the first and second cap insulating layers against the first and second sidewall spacers, and
    after the first and second cap insulating layers are recessed, the recessing the first and second sidewall spacers is performed by selectively etching the first and second sidewall spacers against the first and second cap insulating layers.

7. The method of claim 1, wherein:
    after the forming the first insulating layer, the recessing the first and second sidewall spacers is performed by selectively etching the first and second sidewall spacers against the first and second cap insulating layers, and
    after the forming the first insulating layer and before after the first and second sidewall spacers are recessed, the recessing the first and second cap insulating layers is performed by selectively etching the first and second cap insulating layers against the first and second sidewall spacers.

8. The method of claim 1, wherein when forming the contact hole, corner parts of the first and second protective layers and corner parts of the first and second sidewall spacers located under the first and second protective layers, respectively, are etched but the first and second cap insulating layers are not etched.

9. A method of manufacturing a semiconductor device, the method comprising:
    forming a first gate structure and a second gate structure over a substrate, the first gate structure including a first gate electrode, a first cap insulating layer disposed over the first gate electrode and first sidewall spacers disposed on both side faces of the first gate electrode and the first cap insulating layer, the second gate structure including a second gate electrode, a second cap insulating layer disposed over the second gate electrode and second sidewall spacers disposed on both side faces of the second gate electrode and the second cap insulating layer;

forming a first source/drain region in an area between the first gate structure and the second gate structure;

forming a first insulating layer over the first source/drain region and between the first gate structure and the second gate structure;

after the forming the first insulating layer, recessing the first and second cap insulating layers;

recessing the first and second sidewall spacers to form a first space over the first cap insulating layer that is recessed and the first sidewall spacers that are recessed and a second space over the second cap insulating layer that is recessed and the second sidewall spacers that are recessed;

forming a first protective layer in the first space and a second protective layer in the second space;

forming a second insulating layer over the first and second gate structures having the first and second protective layers;

forming a contact hole over the source/drain region so as to expose the source/drain region; and filling the contact hole with a conductive material to form a contact plug that is in contact with the source/drain region, wherein when forming the contact hole, corner parts of the first and second protective layers and corner parts of the first and second sidewall spacers located under the first and second protective layers, respectively, are etched but the first and second cap insulating layers are not etched.

10. The method of claim 9, wherein the first and second protective layers include at least one selected from the group consisting of a metal nitride based material and amorphous silicon.

11. The method of claim 10, wherein the metal nitride based material is AlON or AlN.

12. The method of claim 9, wherein the amorphous silicon is boron-doped amorphous silicon.

13. The method of claim 9, wherein a material of the first and second sidewall spacers, a material of the first and second cap insulating layer, and a material of the first insulating layer are different from each other.

14. The method of claim 9, wherein:
the first and second sidewall spacers are made of SiOCN,
the first and second cap insulating layer is made of SiN, and
the first insulating layer is made of $SiO_2$.

15. The method of claim 9, wherein the recessing the first and second cap insulating layers is performed before the recessing the first and second sidewall spacers.

16. The method of claim 9, wherein the recessing the first and second sidewall spacers is performed after the forming the first insulating layer and before the recessing the first and second cap insulating layers is performed.

17. The method of claim 9, wherein an upper surface of the first and second cap insulating layers that are recessed is located substantially at a same level as an upper surface of the first and second sidewall spacers that are recessed.

18. A method of manufacturing a semiconductor device, the method comprising:
forming a gate structure over a substrate, the gate structure including a gate electrode, a cap insulating layer disposed over the gate electrode and sidewall spacers disposed on opposing side faces of the gate electrode and the cap insulating layer;

forming a first insulating layer on side faces of the sidewall spaces, the side faces being not in contact with the gate electrode and the cap insulating layer;

after the forming the first insulating layer, removing an upper portion of the cap insulating layer and removing upper portions of the sidewall spacers to form a space over the cap insulating layer and the sidewall spacers, wherein a depth of the space above the cap insulating layer measured from an upper surface of the first insulating layer is different from a depth of the space above the sidewall spacers measured from the upper surface of the first insulating layer;

forming a protective layer in the space such that the first protective layer is formed on the cap insulating layer and on the sidewall spacers; and forming a second insulating layer over the protective layer and the first insulating layer, wherein:
a material of the protective layer, a material of the sidewall spacers, a material of the cap insulating layer and a material of the first insulating layer are different from each other.

19. The method of claim 18, wherein the protective layer is AlON or TaN.

20. The method of claim 18, wherein the protective layer is oxide of aluminum, tantalum, titanium, zirconium or hafnium.

* * * * *